United States Patent
Chow et al.

(10) Patent No.: US 6,855,948 B2
(45) Date of Patent: Feb. 15, 2005

(54) LOW BASE-EMITTER VOLTAGE HETEROJUNCTION BIPOLAR TRANSISTOR

(75) Inventors: David Chow, Newbury Park, CA (US); Kenneth Elliott, Thousand Oaks, CA (US); Chanh Nguyen, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/324,063

(22) Filed: Dec. 18, 2002

(65) Prior Publication Data

US 2003/0166325 A1 Sep. 4, 2003

Related U.S. Application Data

(60) Provisional application No. 60/342,340, filed on Dec. 18, 2001.

(51) Int. Cl.[7] .................... H01L 29/06; H01L 31/0328; H01L 31/0336; H01L 31/072; H01L 31/109
(52) U.S. Cl. .................... 257/18; 257/188; 257/189; 257/190; 438/312; 438/317; 438/343
(58) Field of Search ................... 257/188, 189, 257/190, 312, 18; 438/317, 343, 312, 235

(56) References Cited

U.S. PATENT DOCUMENTS

| | | | | |
|---|---|---|---|---|
| 5,010,382 A | | 4/1991 | Katoh | 257/19 |
| 6,108,360 A | * | 8/2000 | Razeghi | 372/45 |
| 6,462,362 B1 | | 10/2002 | Miyoshi | 257/198 |
| 6,482,711 B1 | * | 11/2002 | Nguyen et al. | 438/317 |
| 6,624,449 B1 | * | 9/2003 | Scott et al. | 257/184 |
| 2002/0070390 A1 | * | 6/2002 | Chow | 257/197 |

FOREIGN PATENT DOCUMENTS

| | | | |
|---|---|---|---|
| JP | 06 209008 A | 7/1994 | |
| JP | 11 087363 A | 3/1999 | |
| JP | 11-087363 | * 3/1999 | H01L/21/331 |
| JP | 2001 144099 A | 5/2001 | |
| JP | 2001 203216 A | 7/2001 | |

\* cited by examiner

Primary Examiner—William M. Brewster
(74) Attorney, Agent, or Firm—Tope-McKay & Associates (57) ABSTRACT

A heterojunction bipolar transistor is presented, comprising a substrate having formed thereon a heterojunction bipolar transistor layer structure, and including an emitter layer. The emitter layer includes a strained, n-doped compound of indium arsenic and phosphorus. The transistor further comprises, between the substrate and emitter layer, a subcollector layer, a collector layer, a base layer, and an optional spacer layer. The emitter layer may include a graded portion. A contact layer is formed on the emitter layer to provide contacts for the device.

58 Claims, 5 Drawing Sheets

LOW BASE-EMITTER VOLTAGE HETEROJUNCTION BIPOLAR TRANSISTOR

PRIORITY CLAIM

This application claims the benefit of priority to U.S. Provisional Application 60/342,340, titled "Low VBE Heterojunction Bipolar Transistor," filed Dec. 18, 2001.

BACKGROUND OF THE INVENTION (1) Technical Field

The present invention relates to solid-state electronic devices. More specifically, the present invention relates to an improved heterojunction bipolar transistor.

(2) Discussion

The transistor is an important example of an "active" component, a device that can amplify an incoming signal to produce an output signal with more power than the input signal. The additional power comes from an external power source.

Two important classes of transistors are field-effect transistors and bipolar junction transistors (BJTs). Broadly speaking both of these classes of transistors are charge-control devices. However, in an npn BJT, the collector-base junction is back-biased so that no current normally flows. Forward-biasing the base-emitter junction causes electrons to enter the base region, where they are attracted to the collector, resulting in a collector current controlled by the base current. The collector current is proportional to the injection rate of minority carriers into the base. This injection rate is an exponential function of the base-emitter potential difference.

An important class of bipolar junction transistors is that of heterojunction bipolar transistors (HBTs). HBTs have been fabricated lattice-matched to GaAs and InP substrates. The applied voltage needed to initiate current flow across the emitter-base junction, $V_{be}$, in these devices ranges from 0.65 to 1.5V, and is an important consideration in device power requirements. There exists a need in the art for a device that exhibits a decreased $V_{be}$ (<0.65V), to enable fabrication of devices such as low supply voltage integrated circuits (ICs) that will consume substantially less power than existing HBT ICs.

There have been many publications related to HBT technologies. Citations to a few recent examples are presented below as further resources for the reader:

(1) Q. Lee et al., IEEE Electron Device Letters, Vol. 19, p. 77 (1998);

(2) P. J. Zampardi et al., IEEE Electron Device Letters, Vol. 17, p. 470 (1996);

(3) Y. Matsuoka et al., J. Appl. Phys., Vol. 35, p. 5646 (1996); (4) D. L. Miller et al., J. Vac. Sci. Technol. B, Vol. 16, p. 1361 (1998); and Pekarik et al., J. Vac. Sci. Technol. B, Vol. 10, p. 1032 (1992)—this particular reference discusses a low $V_{be}$ pnp HBT that has been fabricated from 6.1 Å materials; however, npn HBTs are generally better for high-speed applications because electron mobilities are much greater than hole mobilities (electrons carry the current in a npn device, while holes carry the current in a pnp device).

SUMMARY OF THE INVENTION

BRIEF DESCRIPTION OF THE DRAWINGS

The objects, features and advantages of the present invention will be apparent from the following detailed descriptions of the preferred aspect of the invention in conjunction with reference to the following drawings.

FIG. 5 presents photographs of a set of GaSb-based HBT devices transferred to a sapphire, where FIG. 5(a) shows a set of structures etched to the subcollector layer and FIG. 5(b) shows a set of structures etched to the substrate.

DETAILED DESCRIPTION OF PREFERRED ASPECTS

The present invention relates to solid-state electronic devices. More specifically, the present invention relates to an improved heterojunction bipolar transistor. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of aspects. Thus, the present invention is not intended to be limited to the aspects presented, but is to be accorded the widest scope consistent with the principles and novel features disclosed herein. Furthermore it should be noted that unless explicitly stated otherwise, the figures included herein are illustrated diagrammatically and without any specific scale, as they are provided as qualitative illustrations of the concept of the present invention.

(1) Introduction

The present invention provides a strained $InAs_{1-x}P_x$ (n) emitter layer on an InAs (p) or $InAs_{1-y}Sb_y$ (p) base layer to realize an npn heterojunction bipolar transistor (HBT) with a required base-emitter voltage, $V_{be}$, <0.4 V. Previously constructed npn HBTs are limited to $V_{be}$>0.65 V. This dramatic reduction in $V_{be}$ enables the fabrication of low supply voltage integrated circuits (ICs), which consume substantially less power than existing high-performance HBT ICs.

The base-emitter voltage ($V_{be}$) required to reach operating current in a heterojunction bipolar transistor is a key consideration for designing high-performance integrated circuits using them. Power supply voltages ($V_s$) generally have to be large enough to support multiple $V_{be}$ drops (due to multiple devices connected in series) for a given circuit function. Since IC power consumption varies strongly with supply voltage (power is proportional to $V_s$ for constant current circuits, and to $V_s^2$ for resistive circuits), low $V_{be}$ HBT technology presents a dramatic reduction in power consumption.

In addition to offering reduced IC power consumption, the present invention also meets several prerequisites for a high-performance HBT technology, listed below.

High-speed—Unity gain cutoff frequencies for the low $V_{be}$ npn HBTs are comparable to, or better than, state-of-the-art moderate $V_{be}$ devices, for example, $In_{0.53}Ga_{0.47}As/In_{0.52}Al_{0.48}As/InP$ HBTs.

Robust Materials and Processing—Although processing technology for InAs-based heterostructures is relatively immature, these materials have shown to be amenable to conventional wet and dry etching techniques and good ohmic contacts have been demonstrated. Hence, there is no functional obstacle to developing a true integrated circuit technology.

Insulating, Low-Parasitic Substrate—Although the $InAs_{1-x}P_x$/InAs HBT device is most straightforwardly deposited on an InAs substrate (InAs is not available in insulating form), techniques to bond and transfer the epitaxial layers to a low parasitic, insulating surrogate after molecular beam epitaxial (MBE) growth presently exist.

A few examples of technologies that could benefit from the present invention include commercial applications such as power amplifiers for cellular phones, cable modems, and optical receivers.

(2) Discussion

Figure 1:
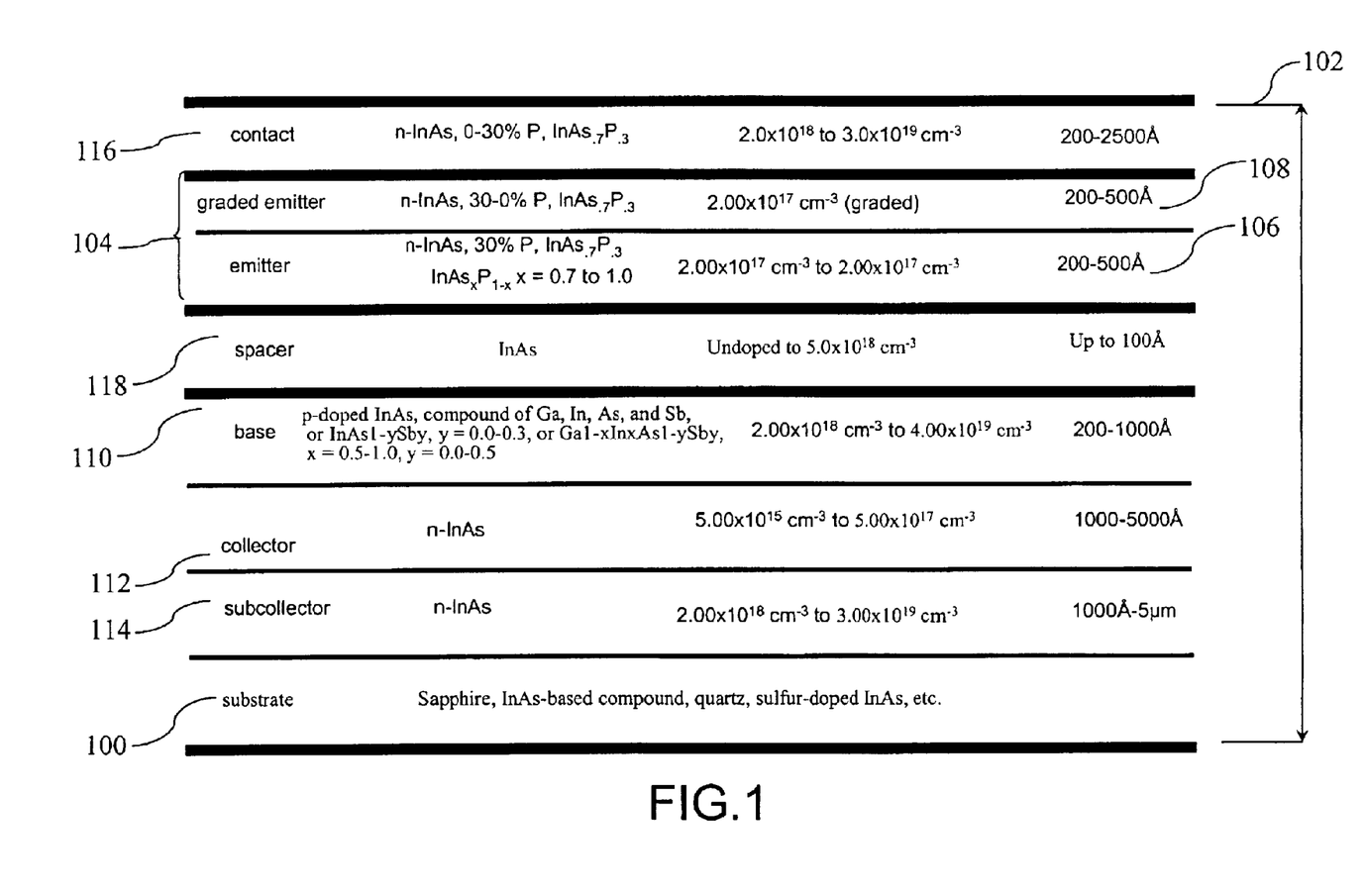
FIG. 1 is a layer diagram/table depicting various aspects of layers used in the present invention.

Referring now to the drawings, FIG. 1 presents a schematic layer sequence diagram for the HBT of the present invention. A conventional emitter/base/collector layer sequence is used. As mentioned previously, applied voltage needed to initiate current flow across the emitter-base junction, $V_{be}$, is a key device parameter for circuit design/operation, as it largely determines power supply voltages. The value of $V_{be}$ is approximately equal to the "built-in" voltage for the emitter-base heterojunction. In particular, in the present invention, the built-in voltage is equal to the energy gap of the base layer plus the conduction band offset between the emitter and base materials. The narrow energy gap of the InAs base layer in the present invention yields a value of $V_{be}$ roughly half that of the nearest established HBT technology. The $V_{be}$ may be further reduced by using strained $InAs_{1-y}Sb_y$ as a base layer. Sb mole fractions as large as x=0.4 may be incorporated to both reduce $V_{be}$ even further and increase the value of the valence band offset between the emitter and base layers.

One aspect of the present invention is the use of a strained $InAs_{1-x}P_x$ layer for the emitter of the HBT. $InAs_{1-x}P_x$ has not been widely used in combination with InAs/AlSb/GaSb heterostructures (often referred to as "6.1 Angstrom" heterostructures because all three materials have lattice parameters near this value) because its growth requires three group V sources in the epitaxial growth system, and critical thickness limitations prevent high-quality growth of thick $InAs_{1-x}P_x$ layers (with high P-content) on InAs or GaSb (the substrates most often used). However, $InAs_{1-x}P_x$ is a superior choice to GaSb, AlSb, AlGaSb, GaInAsSb, or AlInAsSb (the alloys most often combined with InAs) from a band-alignment perspective because its valence band energy lies below that of InAs, and it has only a small conduction band offset with respect to InAs. Another possible emitter material, strained $Al_zIn_{1-z}As$ with low z-value, offers less valence band offset with respect to InAs per unit strain, and much greater conduction band offset than $InAs_{1-x}P_x$.

Specifically, for each layer in FIG. 1, a layer name, layer materials, layer doping levels, and layer thicknesses are provided. It is noteworthy that all doping levels discussed herein and in the claims are in units of $cm^{-3}$. In general, the low base-emitter voltage heterojunction bipolar transistor of the present invention includes a substrate 100 with an HBT layer structure 102 grown epitaxially, and including an emitter layer 104. The emitter layer 104 includes a strained, n-doped compound of indium arsenic and phosphorus. The emitter layer 104, as shown includes a non-graded emitter portion 106 and an optional graded emitter portion 108. The particular structure of the emitter layer 104 used in a particular manifestation of the n-doping level in the HBT layer structure can be graded, non-graded, or any combination thereof. A desirable material combination for the emitter layer 104 is $InAs_xP_{1-x}$, where x is approximately between 0.7 and 1.0. A desirable n-doping level for the emitter layer 104 is approximately between $5\times10^{16}$ and $2\times10^{18}$. A desirable thickness for the emitter layer 104 is approximately 200–500 Å. In the case where a portion of the emitter layer 104 is non-graded, a desirable material choice is $InAs_{0.7}P_{0.3}$.

Between the emitter layer 104 and the substrate 100, a p-doped base layer 110 is provided. The base layer is typically comprised of InAs, InAsSb, or GaInAsSb. It is desirable for the base layer 110 to be p-doped to approximately between $2\times10^{18}$ and $4\times10^{19}$ and approximately 200–100 Å thick. More specifically, the base layer 110 may be comprised of $InAs_{1-y}Sb_y$ where y is approximately 0.0 to 0.3 and $Ga_{1-x}In_xAs_{1-y}Sb_y$ where x is approximately 0.5 to 1.0 and y is approximately 0.0 to 0.5.

Between the base layer 110 and the substrate 100, a collector layer is 112 is shown. The collector layer 112 is typically comprised of n-doped InAs, and is desirably n-doped to approximately between $5\times10^{15}$ and $5\times10^{17}$ and is approximately 1000 to 5000 Å thick.

Additionally, between the collector layer 112 and the substrate 100, a subcollector layer 114 is formed. The subcollector layer is typically comprised of n-doped InAs, is desirably n-doped to approximately between $2\times10^{18}$ and $3\times10^{19}$, and has a thickness of approximately 1000 Å to 5 µm.

A contact 116 is formed on the emitter layer 104 opposite the substrate 100. The contact 116 is typically formed of InAs. A desirable n-doping level for the contact 116 is approximately between $2\times10^{18}$ and $3\times10^{19}$ $cm^{-3}$, and a desirable thickness is approximately 200 to 2500 Å thick.

In the layer structure 102, an optional spacer layer 118 can be formed between the base layer 110 and the emitter layer 104. The spacer layer 118 is desirably p-doped in a range from undoped to $5\times10^{18}$, and is typically formed of InAs at a thickness up to 100 Å.

Any compatible substrate 100 may be used with the present invention. Desirable materials include sapphire, quartz, silicon carbide, aluminum nitride, gallium arsenide, indium phosphide, among other compounds including such as those of indium and arsenic, i.e., sulfur-doped InAs.

Figure 2:
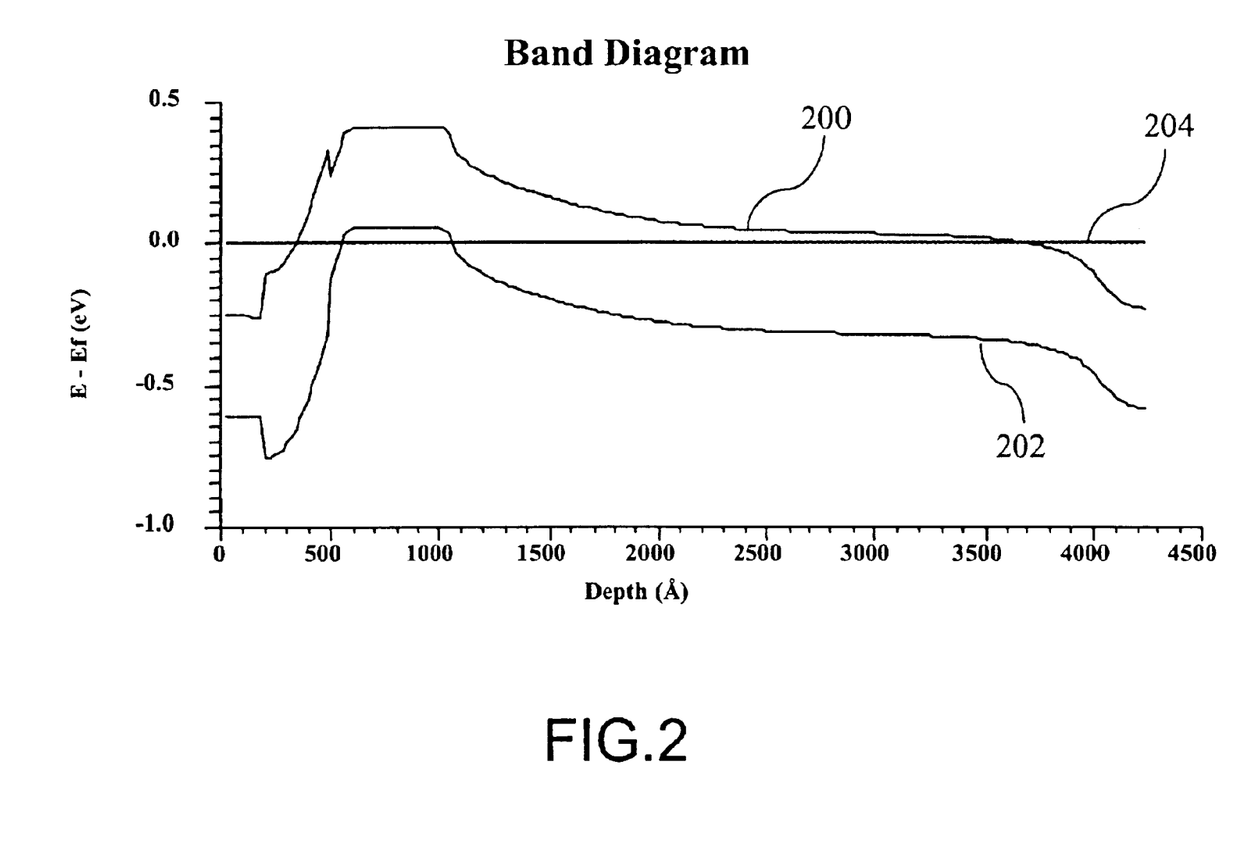
FIG. 2 is a band-edge diagram depicting a conduction band edge, valence band edge, and Fermi level in a device of the present invention with no applied bias.

A band edge diagram for the structure shown in FIG. 1 (neglecting the graded layer) is presented in FIG. 2. The band-edge diagram is qualitatively similar to conventional HBT band edge diagrams, except that the energy gaps in all layers are much smaller. The diagram shows the conduction band edge 200, the valence band edge 202, and the Fermi level in a structure of the present invention with no applied bias.

Figure 3:
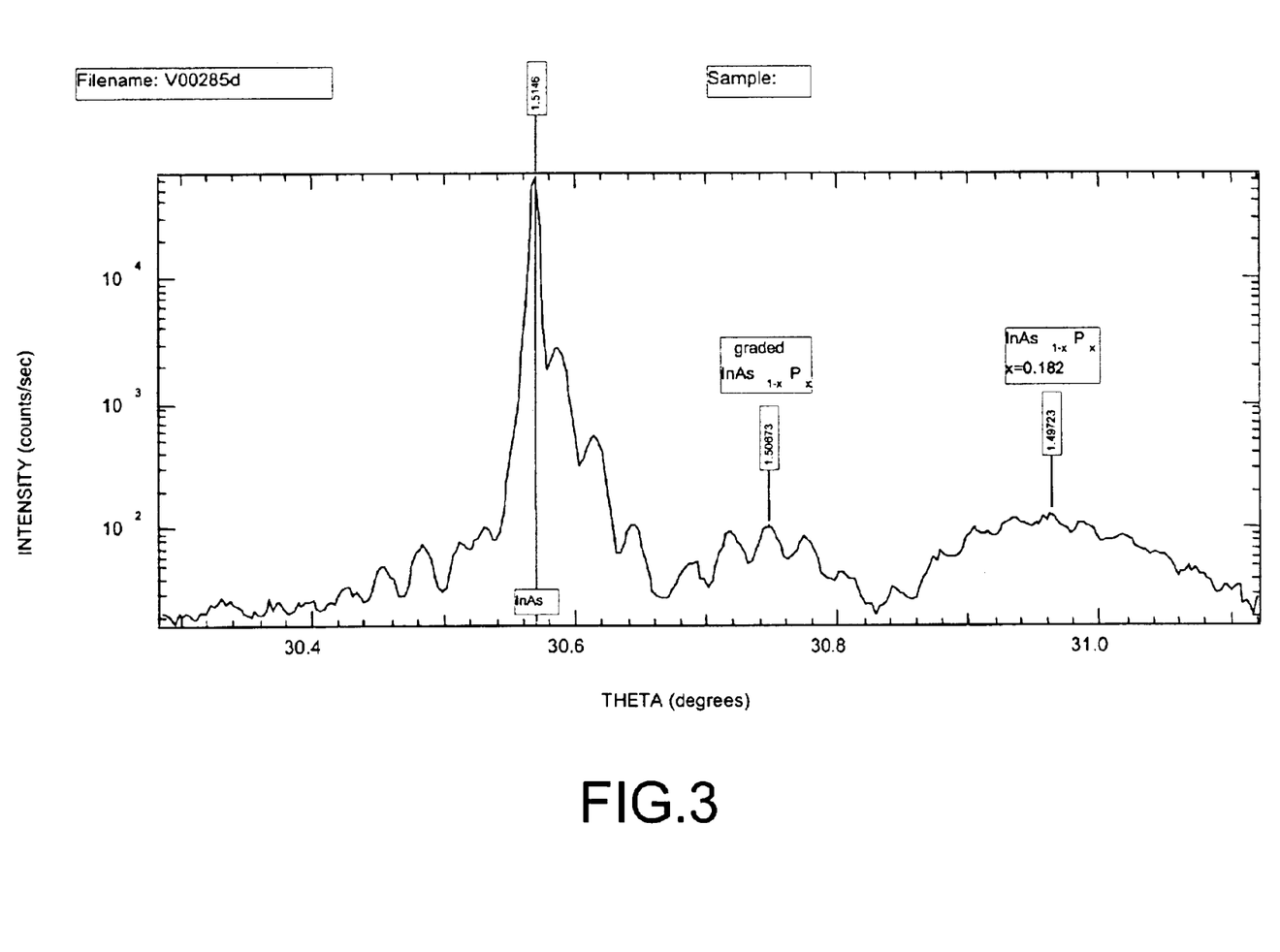
FIG. 3 is a graph of x-ray diffraction data from a device of the present invention.

X-ray diffraction data from a device structure of the family shown in FIG. 1 is presented in FIG. 3, with x=0.182 in an $InAs_{1-x}P_x$ emitter layer, and graded from x=0.182 to x=0.0 in the graded layer above the emitter. The presence of Pendellosung (finite thickness) fringes in the x-ray diffraction data is consistent with good epitaxial structural quality, indicating that the emitter layer is grown below the critical thickness for strain relaxation.

An I–V characteristic obtained from a 10 µm×10 µm emitter HBT device fabricated from the structure described above is presented in FIG. 4(a), with a corresponding Gummel plot shown in FIG. 4(b), where the bottom line represents the base current and the top line representing the collector current, with the ratio of corresponding points representing the device gain. Processing was performed using a standard mask set using contact lithography and a non-self-aligned base metal deposition. Current gain of approximately 200 is demonstrated in the characteristic. The low breakdown voltage observed is a consequence of the narrow gap collector layer (InAs), and can be addressed by grading to a wider gap collector material, such as an InAs/GaSb superlattice or a GaInAsSb alloy. Note the low $V_{be}$ of 0.32 V at $J_c=1.0\times10^4$ A/Cm².

In summary, the structure of the present invention meets the following criteria needed for a high-performance integrated circuit technology.

npn Operation—Electrons are considerably lighter and faster than holes in zincblende semiconductors (e.g., GaAs, InP, InAs, GaSb, AlSb, and related alloys). npn HBTs are generally faster than pnp HBTs because electrons carry the vertical current in npn devices, while holes carry the vertical current in pnp devices.

High Mobility Materials—Electron velocities in InAs, InAsP, and InAsSb are high due to their low effective masses. Base and collector transit times in these structures are short.

Low Base Resistance—InAs can be highly p-doped for a low base resistance (needed for low capacitance charging times).

Low Contact Resistance—n-type contacts to InAs are nearly ideal, and even p-type contacts can be good given small energy gaps produced.

Figure 5:
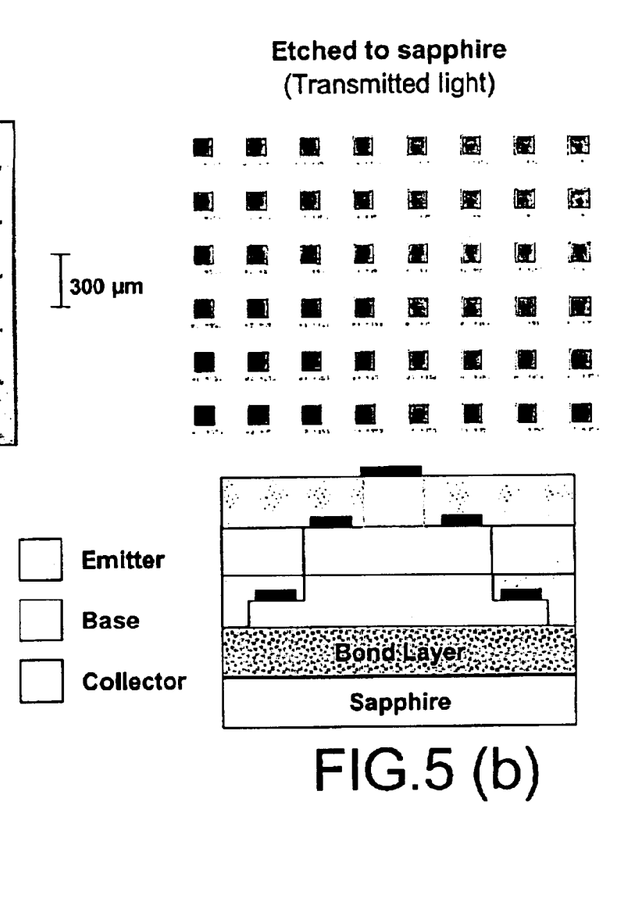

Transfer to Semi-Insulating or Insulating Substrates—An insulating substrate is a requirement for a high-performance integrated circuit technology. A technique has recently been developed to transfer HBT layers grown on GaSb or InAs substrates to sapphire or another insulating material. A photograph of a set of GaSb-based HBT devices transferred to a sapphire substrate is provided in FIG. 5. More specifically, FIG. 5(a) presents a set of structures etched to the subcollector layer, and FIG. 5(b) presents a set of structures etched to the substrate. Horizontal areas 500 outside of the structures 502 are shown to indicate the removed layer portions.

What is claimed is:

1. A heterojunction bipolar transistor comprising a substrate having formed thereon a heterojunction bipolar transistor layer structure including an emitter layer including a strained, n-doped compound of indium arsenic and phosphorus.

2. A heterojunction bipolar transistor as set forth in claim 1, wherein the indium arsenic phosphide compound is $InAs_xP_{1-x}$, where x is approximately between 0.7 and 1.0.

3. A heterojunction bipolar transistor as set forth in claim 2, wherein the n-doping in the emitter layer is approximately between $5\times10^{16}$ and $2\times10^{18}$.

4. A heterojunction bipolar transistor as set forth in claim 3, wherein the n-doping is substantially constant throughout the emitter layer.

5. A heterojunction bipolar transistor as set forth in claim 3, wherein the emitter layer is approximately 200–500 Å thick.

6. A heterojunction bipolar transistor as set forth in claim 5, wherein the heterojunction bipolar transistor layer structure further comprises a p-doped base layer between the emitter layer and the substrate.

7. A heterojunction bipolar transistor as set forth in claim 6, wherein the base layer is comprised of a material selected from a group consisting of InAs, InAsSb, and GaInAsSb.

8. A heterojunction bipolar transistor as set forth in claim 7, wherein the base layer is p-doped to approximately between $2\times10^{18}$ and $4\times10^{19}$.

9. A heterojunction bipolar transistor as set forth in claim 8, wherein the base layer is approximately 200–1000 Å thick.

10. A heterojunction bipolar transistor as set forth in claim 9, wherein the base layer is comprised of a material selected from a group consisting of $InAs_{1-y}Sb_y$ where y is approximately 0.0 to 0.3 and $Ga_{1-x}In_xAs_{1-y}Sb_y$ where x is approximately 0.5 to 1.0 and y is approximately 0.0 to 0.5.

11. A heterojunction bipolar transistor as set forth in claim 10, wherein the heterojunction bipolar transistor layer structure further comprises a collector layer formed between the base layer and the substrate.

12. A heterojunction bipolar transistor as set forth in claim 11, wherein the collector layer is comprised of n-doped InAs.

13. A heterojunction bipolar transistor as set forth in claim 12, wherein the collector layer is n-doped to approximately between $5\times10^{15}$ and $5\times10^{17}$.

14. A heterojunction bipolar transistor as set forth in claim 13, wherein the collector layer is approximately 1000 to 5000 Å thick.

15. A heterojunction bipolar transistor as set forth in claim 14, wherein the heterojunction bipolar transistor layer structure further comprises a subcollector layer formed between the collector layer and the substrate.

16. A heterojunction bipolar transistor as set forth in claim 15, wherein the subcollector layer is comprised of n-doped InAs.

17. A heterojunction bipolar transistor as set forth in claim 16, wherein the subcollector layer is n-doped to approximately between $2\times10^{18}$ and $3\times10^{19}$.

18. A heterojunction bipolar transistor as set forth in claim 17, wherein the subcollector layer is approximately 1000 Å to 5 μm thick.

19. A heterojunction bipolar transistor as set forth in claim 18, wherein a contact is formed on the emitter layer opposite the substrate.

20. A heterojunction bipolar transistor as set forth in claim 19, wherein the contact is formed of InAs.

21. A heterojunction bipolar transistor as set forth in claim 20, wherein the contact is n-doped to approximately between $2\times10^{18}$ and $3\times10^{19}$ cm⁻³.

22. A heterojunction bipolar transistor as set forth in claim 21, wherein the contact is approximately 200 to 2500 Å thick.

23. A heterojunction bipolar transistor as set forth in claim 22, wherein a spacer layer is formed between the base layer and the emitter layer.

24. A heterojunction bipolar transistor as set forth in claim 23, wherein the spacer layer is p-doped in a range from undoped to $5\times10^{18}$.

25. A A heterojunction bipolar transistor as set forth in claim 24, wherein the spacer layer is formed of InAs.

26. A heterojunction bipolar transistor as set forth in claim 25, wherein the spacer layer is up to 100 Å thick.

27. A heterojunction bipolar transistor as set forth in claim 26, wherein the substrate is comprised of a material selected from sapphire and a compound including indium and arsenic.

28. A heterojunction bipolar transistor as set forth in claim 27, wherein the substrate is comprised of sulfur-doped InAs.

29. A heterojunction bipolar transistor as set forth in claim 3, wherein the n-doping is graded across at least a portion of the emitter layer.

30. A heterojunction bipolar transistor as set forth in claim 29, wherein the non-graded portion of the emitter is comprised of $InAs_{0.7}P_{0.3}$.

31. A heterojunction bipolar transistor as set forth in claim 1, wherein the heterojunction bipolar transistor layer structure further comprises a p-doped base layer between the emitter layer and the substrate.

32. A heterojunction bipolar transistor as set forth in claim 31, wherein the base layer is comprised of a material selected from a group consisting of InAs, InAsSb, and GaInAsSb.

33. A heterojunction bipolar transistor as set forth in claim 32, wherein the base layer is p-doped to approximately between $2 \times 10^{18}$ and $4 \times 10^{19}$.

34. A heterojunction bipolar transistor as set forth in claim 33, wherein the base layer is approximately 200–1000 Å thick.

35. A heterojunction bipolar transistor as set forth in claim 34, wherein the base layer is comprised of a material selected from a group consisting of $InAs_{1-y}Sb_y$ where y is approximately 0.0 to 0.3 and $Ga_{1-x}In_xAs_{1-y}Sb_y$ where x is approximately 0.5 to 1.0 and y is approximately 0.0 to 0.5.

36. A heterojunction bipolar transistor as set forth in claim 1, wherein the heterojunction bipolar transistor layer structure further comprises a collector layer formed between the base layer and the substrate.

37. A heterojunction bipolar transistor as set forth in claim 36, wherein the collector layer is comprised of n-doped InAs.

38. A heterojunction bipolar transistor as set forth in claim 37, wherein the collector layer is n-doped to approximately between $5 \times 10^{15}$ and $5 \times 10^{17}$.

39. A heterojunction bipolar transistor as set forth in claim 38, wherein the collector layer is approximately 1000 to 5000 Å thick.

40. A heterojunction bipolar transistor as set forth in claim 1, wherein the heterojunction bipolar transistor layer structure further comprises a subcollector layer formed between the collector layer and the substrate.

41. A heterojunction bipolar transistor as set forth in claim 40, wherein the subcollector layer is comprised of n-doped InAs.

42. A heterojunction bipolar transistor as set forth in claim 41, wherein the subcollector layer is n-doped to approximately between $2 \times 10^{18}$ and $3 \times 10^{19}$.

43. A heterojunction bipolar transistor as set forth in claim 42, wherein the subcollector layer is approximately 1000 Å to 5 µm thick.

44. A heterojunction bipolar transistor as set forth in claim 1, wherein a contact is formed on the emitter layer opposite the substrate.

45. A heterojunction bipolar transistor as set forth in claim 44, wherein the contact is formed of InAs.

46. A heterojunction bipolar transistor as set forth in claim 45, wherein the contact is n-doped to approximately between $2 \times 10^{18}$ and $3 \times 10^{19}$ cm$^{-3}$.

47. A heterojunction bipolar transistor as set forth in claim 46, wherein the contact is approximately 200 to 2500 Å thick.

48. A heterojunction bipolar transistor as set forth in claim 1, wherein a spacer layer is formed between the base layer and the emitter layer.

49. A heterojunction bipolar transistor as set forth in claim 48, wherein the spacer layer is p-doped in a range from undoped to $5 \times 10^{18}$.

50. A heterojunction bipolar transistor as set forth in claim 49, wherein the spacer layer is formed of InAs.

51. A heterojunction bipolar transistor as set forth in claim 50, wherein the spacer layer is approximately up to 100 Å thick.

52. A heterojunction bipolar transistor as set forth in claim 1, wherein the substrate is comprised of a material selected from sapphire and a compound including indium and arsenic.

53. A heterojunction bipolar transistor as set forth in claim 52, wherein the substrate is comprised of sulfur-doped InAs.

54. A method for making a low base-emitter voltage heterojunction bipolar transistor comprising steps of providing a substrate and forming thereon thereon a heterojunction bipolar transistor layer structure lattice-matched to, and including an emitter layer including a strained, n-doped compound a compound of indium arsenic and phosphorus.

55. A method as set forth in claim 54, wherein the indium arsenic phosphide compound is $InAs_xP_{1-x}$, where x is approximately between 0.7 and 1.0.

56. A method as set forth in claim 55, wherein the n-doping in the emitter layer is approximately between $5 \times 10^{16}$ and $2 \times 10^{18}$.

57. A method as set forth in claim 56, wherein the n-doping is substantially constant throughout the emitter layer.

58. A method as set forth in claim 57, wherein the emitter layer is approximately 200–500 Å thick.

* * * * *

UNITED STATES PATENT AND TRADEMARK OFFICE
CERTIFICATE OF CORRECTION

Figure 4:
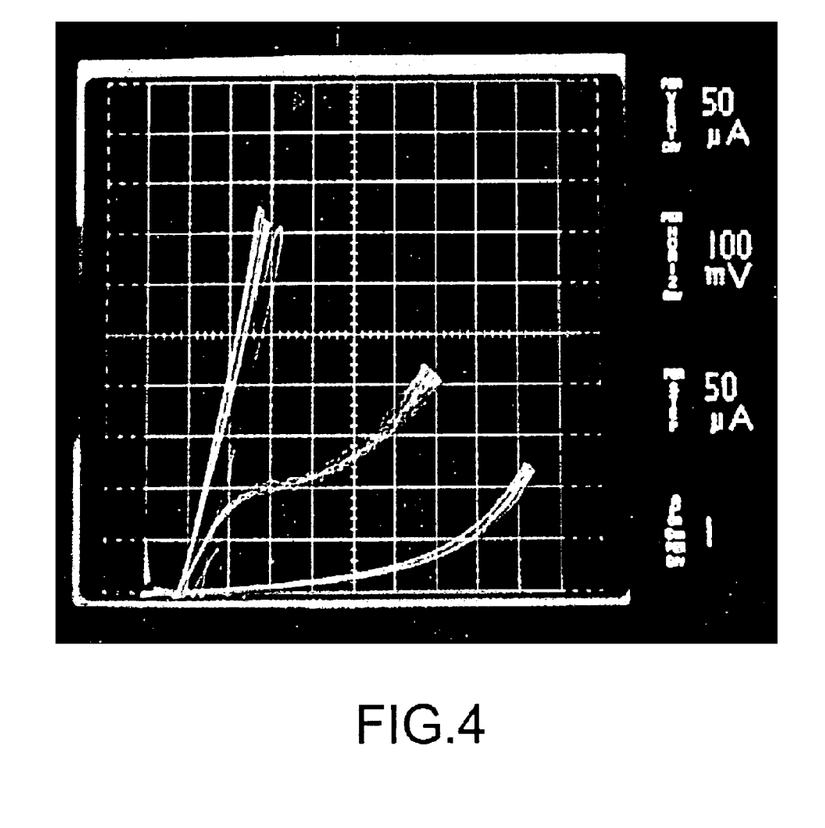
FIG. 4(a) is a current-voltage (I–V) diagram of data from a device of the present invention.
FIG. 4(b) is a Gummel plot of data from a device of the present invention.

PATENT NO. : 6,855,948 B2  Page 1 of 1
APPLICATION NO. : 10/324063
DATED : February 15, 2005
INVENTOR(S) : David Chow and Elliott Ken It is certified that error appears in the above-identified patent and that said Letters Patent is hereby corrected as shown below:

In the specification:

Column 2, lines 10-14, should read:
-- FIG. 4~~(a)~~ is a current-voltage (I-V) diagram of data from a device of the present invention;
~~FIG. 4(b) is a Gummel plot of data from a device of the present invention; and~~ --

Column 4, line 16:
"100Å" should read -- 1000Å --

Column 4, lines 64-65 should read:
-- presented in FIG. 4~~(a), with a corresponding Gummel plot shown in FIG. 4(b)~~ --

In the claims:

Claim 54, column 8, line 35 should read:
-- compound ~~a compound~~ of indium arsenic and phosphorus. --

Signed and Sealed this

Sixth Day of January, 2009

JON W. DUDAS
*Director of the United States Patent and Trademark Office*